United States Patent [19]

Moopenn et al.

[11] Patent Number: 4,839,859

[45] Date of Patent: Jun. 13, 1989

[54] HIGH DENSITY ASSOCIATIVE MEMORY

[75] Inventors: Alexander W. Moopenn; Anilkumar P. Thakoor, both of Pasadena; Taher Daud, La Crescenta, all of Calif.; John J. Lambe, Redmond, Wash.

[73] Assignee: The California Institute of Technology, Pasadena, Calif.

[21] Appl. No.: 128,872

[22] Filed: Dec. 4, 1987

[51] Int. Cl.[4] .............................................. G11C 11/00
[52] U.S. Cl. ..................................... 365/100; 365/148
[58] Field of Search .................. 365/100, 94, 103, 104, 365/96, 148, 49

[56] References Cited

U.S. PATENT DOCUMENTS

| 3,863,231 | 1/1975 | Taylor | 365/100 |
| 4,272,833 | 6/1981 | Taylor | 365/100 X |
| 4,396,998 | 8/1983 | Hunt et al. | 365/100 X |
| 4,441,167 | 4/1984 | Principi | 365/100 X |

OTHER PUBLICATIONS

K. Steinbuch et al., "Learning Matrices and Their Applications", IEEE Transactions on Electron Computers, Dec. 1963, pp. 816–862.

Primary Examiner—Joseph A. Popek
Attorney, Agent, or Firm—Donald A. Streck; Edward O. Ansell

[57] ABSTRACT

A multi-layered, thin-film, digital memory having associative recall. There is a first memory matrix and a second memory matrix. Each memory matrix comprises, a first layer comprising a plurality of electrically separated row conductors; a second layer comprising a plurality of electrically separated column conductors intersecting but electrically separated from the row conductors; and, a plurality of resistance elements electrically connected between the row condutors and the column conductors at respective intersections of the row conductors and the column conductors, each resistance element comprising, in series, a first resistor of sufficiently high ohmage to conduct a sensible element current therethrough with virtually no heat-generating power consumption when a low voltage as employed in thin-film applications is applied thereacross and a second resistor of sufficiently high ohmage to conduct no sensible current therethrough when a low voltage as employed in thin-film applications is applied thereacross, the second resistor having the quality of breaking down to create a short therethrough upon the application of a breakdown level voltage across the first and second resistors.

19 Claims, 4 Drawing Sheets

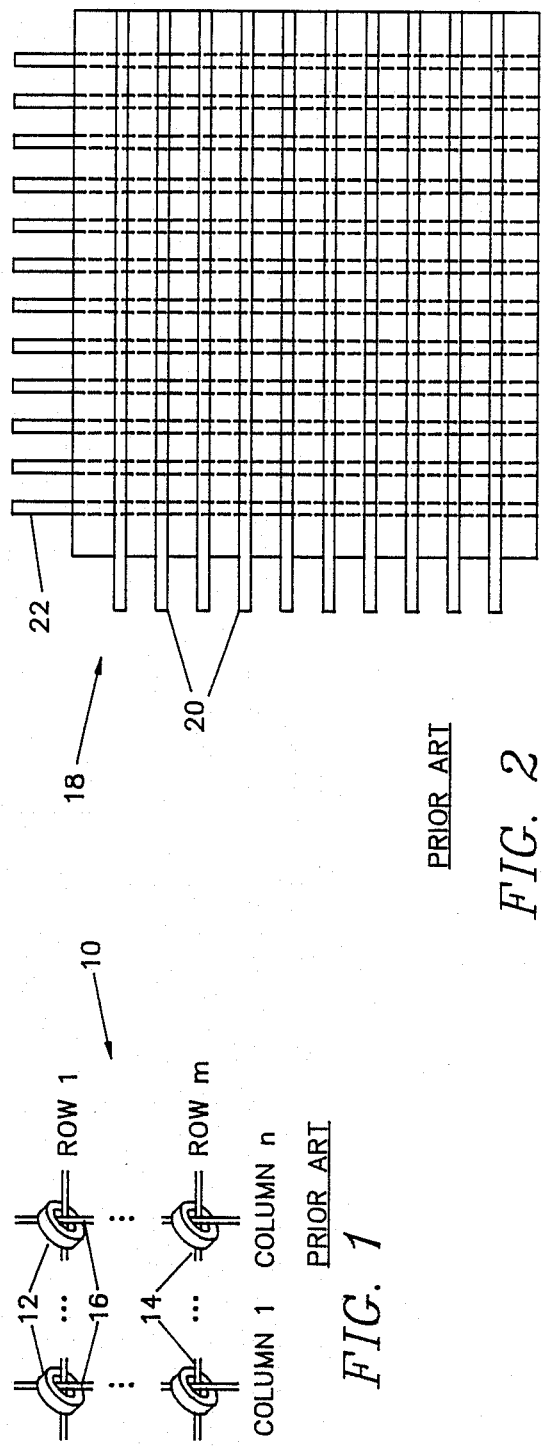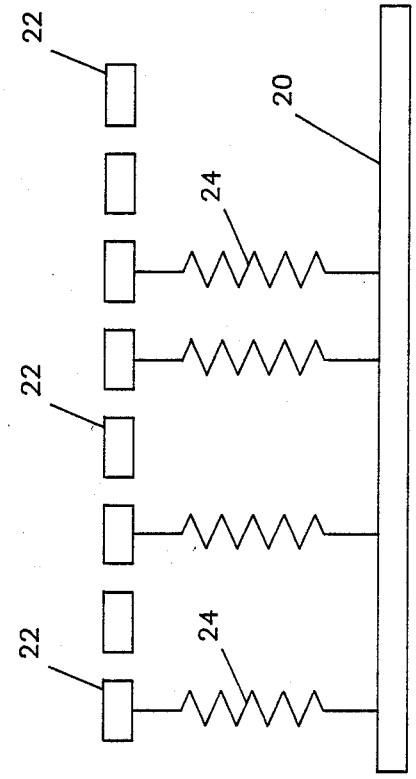

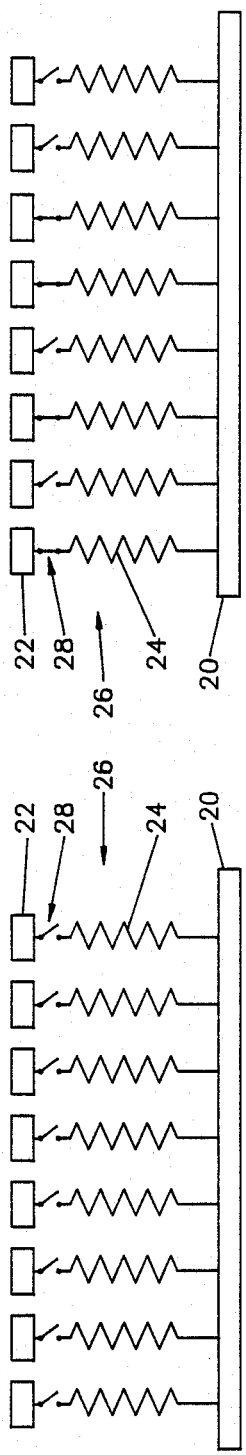
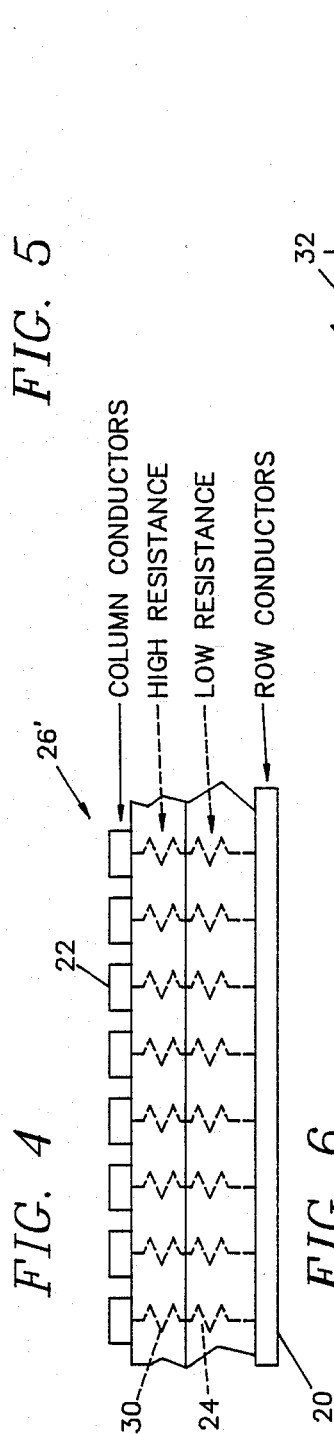
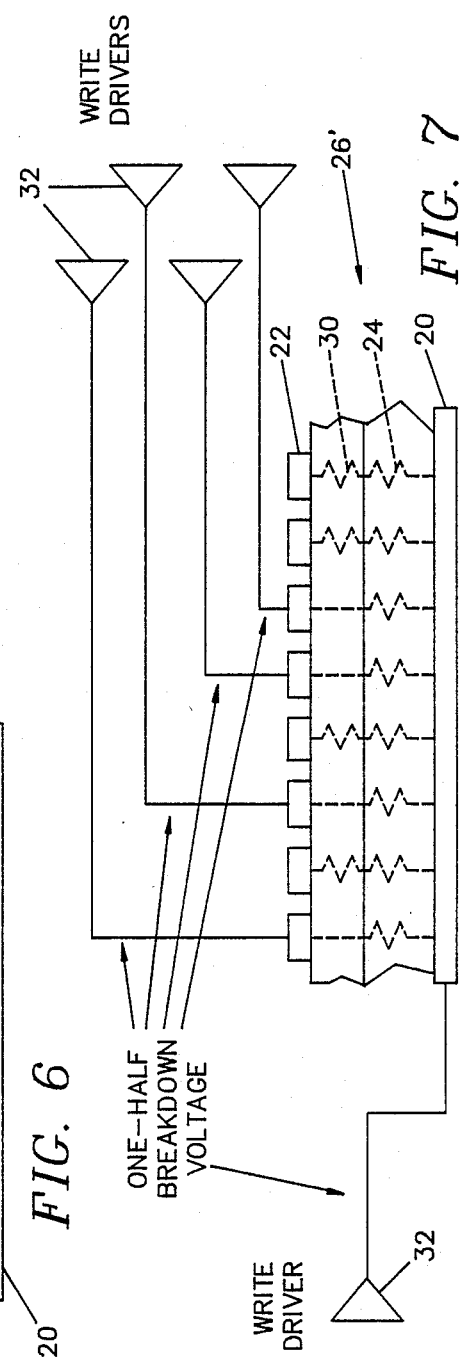

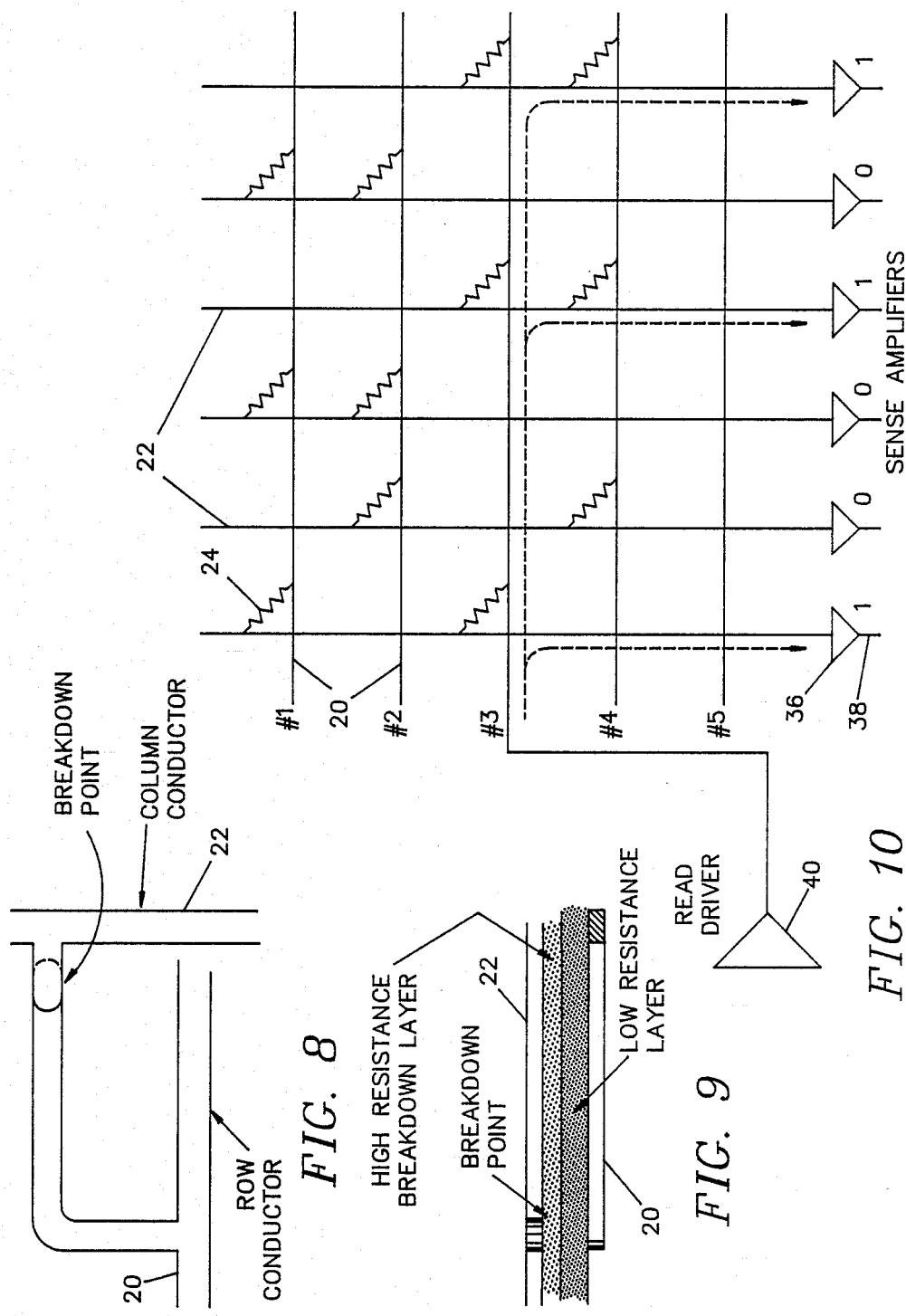

HIGH DENSITY ASSOCIATIVE MEMORY

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

The present invention relates to mass emory for computers having associative recall capability and, more particularly, to a multi-layered, thin-film, digital memory having associative recall comprising, a first memory matrix and a second memory matrix, each memory matrix comprising, (1) a first layer comprising a plurality of electrically separated row conductors; (2) a second layer comprising a plurality of electrically separated column conductors intersecting but electrically separated from the row conductors; and, (3) a plurality of resistance elements electrically connected between the row conductors and the column conductors at respective intersections of the row conductors and the column conductors, each resistance element comprising, in series, a first resistor of sufficiently high ohmage to conduct a sensible current therethrough with virtually no heat-generating power consumption when a low voltage as employed in thin-film applications is applied thereacross and a second resistor of sufficiently high ohmage to conduct no sensible current therethrough when a low voltage as employed in thin-film applications is applied thereacross, the second resistor having the quality of breaking down to create a short therethrough upon the application of a breakdown level voltage across the first and second resistors; a plurality of bi-stable sense amplifier means each having an input connected to a respective one of the column conductors of the second matrix for indicating at an output thereof when a current flow is detected at the input in the one of the column conductors of the second matrix connected thereto; a plurality of current summing amplifier means each having an output connected to a respective one of the row conductors of the second matrix for applying a voltage to the one of the row conductors of the second matrix connected thereto when the current into a second input thereof exceeds the current into a first input thereof, the row conductors of the first matrix being electrically connected to respective ones of the second inputs; a plurality of bi-stable read driver means each having an output connected to a respective one of the column conductors of the first matrix for outputting a voltage when an input thereof has a binary "1" prompt value applied thereto and for not outputting a voltage when the input thereof has a binary "0" prompt value applied thereto; and, ramped read driver means having an output connected to the first inputs of the current summing amplifier means for producing a downward ramp at the output thereof starting at a value higher than the maximum possible value at the second inputs and decreasing until one of the current summing amplifier means has its second input value higher than the output of the ramped read driver means and applies a voltage to the one of the row conductors of the second matrix connected thereto.

Computer memory has gone through much evolution in the short time that digital computers have been generally available. The original computers had only one memory—a rotating drum with a magnetizable surface rotating past a plurality of read and write heads. With the advent of so-called core memory for the "main" memory, there was a functional split between the main memory which was generally small (12–16K words), high priced, and bulky and mass memory that provided storage at a much lower price per word for large masses of data and programs that were only used occasionally. As depicted in FIG. 1, the early core memories 10 comprised a plurality of annular ferrite cores 12 strung on a matrix of row and column wires 14 and 16. The core memories offered random access to each word stored therein (i.e. equal access time) while the mass storage devices (such as the drum memories) had inherent access times caused by rotational delays of the drum with respect to the read heads. Later developed rotational mass storage devices such as disk drives reduced the size of the device; but, did nothing to overcome the rotational delays and, in fact, added additional delays in the form of arm movement radially in an out to position the heads on the disk.

More exotic developments in the memory art have provided main memory without the old ferrite cores and the ability to offer large memory matrices such as that indicated as 18 in FIG. 2 with no moving parts. The memory matrix 18 has row conductors 20 on one layer and column conductors 22 on an adjacent layer. The interconnections between the conductors 20, 22 are accomplished with transistors, or the like, which can be set to a "1" or "0" state (i.e. bi-stable or binary in nature) and then be read at a later time. Main memory is now routinely offered in mega-bytes with mass memory still limited to the use of rotational devices with their inherent limitations (imposed for a great part by a 3,00 rpm rotational maximum) or the use of main memory technology.

Space applications for computers have imposed additional constraints on memory technology. Many devices and technologies react unfavorably to the radiation encountered in space. At present, there is no memory available which offers large storage capacity in a small space employing thin film technology in a manner which has no moving parts and is radiation resistant.

STATEMENT OF THE INVENTION

This invention provides a mass memory for digital computers which has the capability of large storage capacity in a small space and employing thin film technology in a manner which has no moving parts and is radiation resistant. More particularly, the invention is directed to the method and associated apparatus for constructing, writing to, and reading from a multi-layered, thin-film, radiation-resistant, digital memory with associative recall capability comprising the steps of:

constructing a first memory matrix and a second memory matrix wherein the construction of each matrix comprises the steps of, forming a first layer comprising a plurality of electrically separated row conductors;

forming a second layer comprising a plurality of electrically separated column conductors intersecting but electrically separated from the row conductors; and, forming a plurality of resistance elements electrically connected between the row conductors and the column conductors at respective intersections of the row conductors and the column conductors wherein each resistance element comprises, in series, a first resistor of sufficiently high ohmage to conduct a sensible current therethrough with virtually no heat-generating power consumption when a low voltage as employed in thin-film applications is applied thereacross and a second resistor of sufficiently high ohmage to conduct no sensible current therethrough when a low voltage as employed in thin-film applications is applied thereacross;

writing output data into the second memory matrix by applying a voltage across each second resistor thereof wherein there is to be a binary "1" sufficiently high so as to break down that second resistor and create a short therethrough;

writing associative input data into the first memory matrix by applying a voltage across each second resistor thereof wherein there is to be a binary "1" sufficiently high so as to break down that second resistor and create a short therethrough;

connecting the inputs of a plurality of bi-stable sense amplifiers to respective ones of the column conductors of the second matrix to indicate at outputs thereof when a current flow is detected at the input in the one of the column conductors of the second matrix connected thereto;

connecting the outputs of a plurality of current summing amplifiers to respective ones of the row conductors of the second matrix to apply a voltage to the one of the row conductors of the second matrix connected thereto when the current into a second input thereof exceeds the current into a first input thereof;

electrically connecting respective ones of the row conductors of the first matrix to the second inputs;

connecting the outputs of a plurality of bi-stable read drivers to respective ones of the column conductors of the first matrix to output a voltage when an input thereof has a binary "1" prompt value applied thereto and to not output a voltage when the input thereof has a binary "0" prompt value applied thereto;

applying a prompt value to be used for associative recall to the inputs of the plurality of read drivers;

connecting the output of a ramped read driver to the first inputs of the current summing amplifiers and producing a downward ramp at the output thereof starting at a value higher than the maximum possible value at the second inputs and decreasing until one of the current summing amplifiers has its second input value higher than the output of the ramped read driver and applies a voltage to the one of the row conductors of the second matrix connected thereto; and, reading the contents of the associated word in the second memory matrix at the outputs of the sense amplifiers.

The preferred method additionally comprises the steps of connecting the inputs of an OR gate to respective ones of the row conductors of the second matrix and outputting a stop ramp command from the OR gate to the ramped read driver to cause the ramp to stop when a current summing amplifier has ts second input value higher than the output of the ramped read driver and applies a voltage to the one of the row conductors of the second matrix connected thereto.

LIST OF CITED REFERENCES

1. Co-pending application Ser. No. 157,318, filed Feb. 16, 1988 titled MEMORY SWITCHES BASED ON REACTIVELY SPUTTERED $MnO_{2-x}$ THIN FILMS by R. Ramesham, A. Thakoor & J. Lambe assigned to the common assignee of this application.

2. Co-pending application Ser. No. 761,185 filed July 31, 1985 titled THIN FILM MEMORY MATRIX by A. Thakoor, A. Moopenn & J. Lambe assigned to the common assignee of this application.

3. Co-pending continuation-in-part application Ser. No. 857,076 filed Apr. 29, 1986 titled THIN FILM MEMORY MATRIX by A. Thakoor, A. Moopenn & J. Lambe assigned to the common assignee of this application.

DISCUSSION OF THE CITED REFERENCES

The cited references, which are incorporated herein by reference, teach a preferred manner of forming the thin film resistors which are incorporated into the memory of the present invention.

BRIEF DESCRIPTION OF THE DRAWINGS

FIG. 1 is a simplified drawing of prior art core memory.

FIG. 2 is a simplified drawing of a memory matrix according to the prior art in which row and column conductors on different levels are interconnected at their intersections by bi-stable devices which can be written and read.

FIG. 3 is a simplified symbolic representation of the basic approach to the memory of the present invention.

FIG. 4 is a simplified symbolic representation of the basic approach to the memory of the present invention as constructed and prior to data being written into the memory.

FIG. 5 is a simplified symbolic representation of the memory of FIG. 4 after data has been written into the memory.

FIG. 6 is a simplified side view of the layers of thin film comprising a memory matrix of the present invention in the manner of FIG. 4, i.e. as constructed and prior to data being written into the memory.

FIG. 7 shows the layers of FIG. 6 and the manner of permanently writing data thereto.

FIG. 8 is a detailed plan view drawing of one bit position of the memory of the present invention and its preferred manner of construction according to tested embodiments thereof.

FIG. 9 is a side view of the bit position of Figure 8.

FIG. 10 is a simplified drawing showing a portion of a single matrix according to the present invention and the preferred manner of reading it on an addressed word basis.

DETAILED DESCRIPTION OF THE INVENTION

Figure 11:
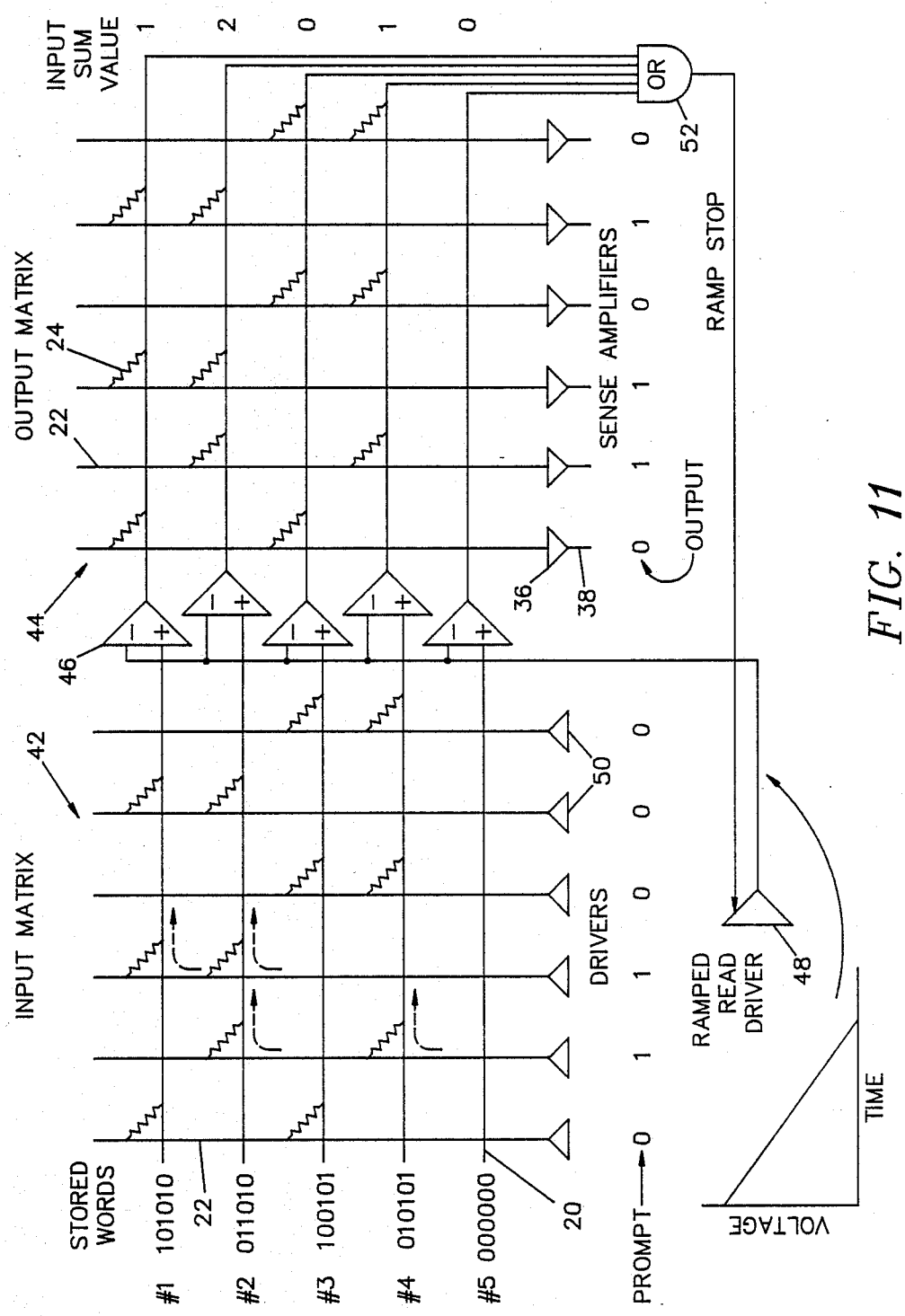
FIG. 11 is a simplified drawing showing a portion of a double matrix according to the present invention and the preferred manner of reading it on an associative basis.

The present invention was derived from investigations into the structure and operation of the human brain and, in particular, the neurons and the synapse connections between them. The basis upon which the memory to be described in detail hereinafter is constructed can be understood with reference to FIG. 3 wherein it is depicted in simplified form. If there are row conductors 20 on one layer and column conductors on a spaced adjacent layer and if a resistance path can be created at the intersections of the conductors 20, 22 where a binary "1" is to exist (as represented by the resistors 24), a current through the path can be sensed and, therefore the contents of multiple intersections representing data can be read. Moreover, if the resistance of a "1" intersection is accurately set in the order of one meg-ohm and a "0" intersection is a resistance of several orders of magnitude larger, the difference between a "1" and a "0" will be detectable and the power consumption (and, therefore heat generated) can be made to be insignificant.

Turning now to FIG. 4, a memory segment 26 according to the present invention is shown in simplified symbolic form following construction and prior to data being written therein. Each intersection between a row conductor 20 and a column conductor 22 has a connection comprising a resistor 24 in series with a switch 28. The resistors are substantially identical and of about one meg-ohm. As symbolically depicted in FIG. 5, data is written into the memory segment 26 by closing the switches 28 where a "1" is desired, thus connecting the resistor 24 between the row conductor 20 and a column conductor 22 at that intersection.

Turning now to FIG. 6, an actual memory segment 26' according to the present invention is shown in simplified form following construction and prior to data being written therein. Each intersection between a row conductor 20 and a column conductor 22 has a connection comprising a low resistance resistor 24 in series with a high resistance resistor 30. The resistors 24 are substantially identical and of about one meg-ohm. The resistors 30 are several orders of magnitude larger. As depicted in FIG. 7, data is written into the memory segment 26' by connecting write drivers 32 across the intersections where a "1" is desired. Each driver 32 is at one-half the breakdown potential of the high resistance resistor 30 in the path. One driver 32 across a given intersection is negative while the other is positive; thus, the potential across the high resistance resistor 30 is equal to the breakdown voltage causing the resistor to breakdown or short, thereby connecting only the resistor 24 between the row conductor 20 and a column conductor 22 at that intersection.

The preferred material for construction of memories according to the present invention at this time is hydrogenated amorphous silicon. An instant advantage of this material is its resistance to being affected by radiation. As mentioned under the Discussion of the Cited References section, the co-pending patent applications listed in the List of Cited References section describe in detail the preferred manner of forming the resistors employed in the memory of the present invention and reference should be made thereto for more details of process which forms no patentable part of this invention. The preferred structure of each intersection of this invention subsequent to formation and prior to data writing is depicted in FIGS. 8 and 9. The row conductor 20 on one layer is connected to the column conductor on another layer by a formed resistance path comprising the resistor 24 on the same layer as one conductor 20, 22 and an overlapping spaced breakdown point separated by a breakdown layer 34 comprising the resistor 30. A memory structure constructed thus is capable of storing up to $10^9$ bits per cm$^2$. Having thus described the preferred manner of constructing and writing into the memory of the present invention, the preferred architecture therefor to achieve additional benefits will now be described in detail.

As those skilled in the art will appreciate from the description heretofore, the memory of the present invention is, of course, a read only memory or ROM; that is, once the data has been written, it cannot be changed. In its simplest or basic form, it can exist as a single matrix as shown in simplified form in FIG. 10 wherein a sequence of five six-bit words according to the present invention are shown following writing. Words 1–5 (from top to bottom) comprise the digital words 101010, 011010, 100101, 010101, and 000000, where a "1" bit is symbolized by a resistor across the intersection indicating a resistive path for current flow and a "0" bit is symbolized by the absence of a resistor (i.e. a very large resistance affording virtually no path for current flow by comparison). In this embodiment, the words are addressed by row. Accordingly each column conductor 22 is connected to a sense amplifier 36 of a type well known to those skilled in the art which senses the presence of current flow and has an output 38 from which the status of the amplifier (and thereby the status of the line connected thereto) can be determined. To read the contents of word #3, for example, a read driver 40 is connected to the row conductor 20 for word #3 to apply a voltage thereto. In the case of word #3, sufficient current will flow through the resistors 24 at the intersections of bit positions 1, 4, and 6 (as indicated by the dashed arrows) to be sensed by the sense amplifiers 36 connected to those column conductors 22 while insufficient current will flow through the remaining intersections to be sensed. Accordingly, the outputs 38 of the sense amplifiers 36 will properly indicate the contents of word #3 as being 100101.

Turning now to FIG. 11, the memory of the present invention is shown in its preferred embodiment which affords associative addressing capability. As will be appreciated from the description which follows, this capability can be employed in a variety of ways to accomplish various results according to the requirements of the application. In this embodiment, there are two memory matrices, each constructed according to the teachings as hereinbefore provided. In particular, there is an input matrix 42 and an output matrix 44. For ease of comparison, the same simplified matrix of FIG. 10 has been employed in this example. The output matrix 44 contains the data which is to be read. The input matrix 42 contains the data by which the data in the output matrix 44 is to be associatively accessed. In the example and embodiment shown in FIG. 11, the contents of matrices 42, 44 are identical; that is, the input matrix 42 is a duplicate of the output matrix 44 such that the output matrix 44 can be associatively accessed as a function of its contents as represented by the contents of the input matrix 42 in a manner to be described in detail shortly. By writing the contents of the input matrix 42 with data related to the contents of the output matrix 44, the output matrix 44 can be associatively accessed as a function of that other data; for example, random address, indices, or the like.

Turning now to the specifics of the embodiment of FIG. 11, each row conductor 20 of the output matrix 44 is connected to the output of a current summing amplifier 46 characterized by having a voltage output only when the positive (+) input thereof exceeds its negative (−) input. The positive input of each current summing amplifier 46 is connected to the corresponding row conductor 20 of the input matrix 42. The negative input of each summing amplifier 46 is connected to the output of a common ramped read driver 48. The characteristics and operation of the driver 48 will be returned to shortly. The column conductors 22 of the output matrix 44 are connected to respective ones of a plurality of sense amplifiers 36 in the same manner as the matrix of FIG. 10. The column conductors 22 of the input matrix 42 are connected to the outputs of respective ones of a plurality of drivers 50 which can be loaded with (i.e. be changably set to output) binary associative prompt values. Finally, the row conductors 20 of the output matrix 44 are connected as individual inputs to an OR gate 52 having an output connected to the ramped reader driver 48. The associative operation of these components will now be described.

The ramped read driver 48 outputs a declining ramp voltage to all the summing amplifiers 46. The voltage is chosen to start high enough to assure that all the amplifiers 46 are forced OFF. A binary prompt value is first loaded into the drivers 50. For example, let us assume that it is desired to find the contents of the word in the output matrix 44 which is closest to binary 011000. Note that this exact binary value does not exist in the output matrix 44. The associative nature of the present invention is such that it will find the word closest to the prompt value. Prompted by the value 011000, the second and third drivers 50 will apply an output to their respective column conductors 22 while the remaining drivers 50 will not produce an output. As indicated by the dashed arrows, the output from the second driver 50 has two "low" resistance connections for current flow to row conductors 20, i.e. at words #2 and #4. Similarly, the output from the third driver 50 has two "low" resistance connections to row conductors 20, i.e. at words #1 and #2. As a result, the summing amplifier 46 for word #1 has a current input level of one, indicating one "right" bit in the word relative to the prompt value. The summing amplifier 46 for word #2 has an input level of two (i.e. there are two current paths inputting to it), indicating two "right" bits in the word relative to the prompt value while the amplifier 46 for word #4, like the amplifier 46 for word #1, has a current input value of one. Under those conditions, the ramp out of the ramped read driver 48 is decreased until one of the current summing amplifiers 46 has its positive input exceed its negative input. In this case, the word #2 amplifier with a positive value associated with two current paths will be the first to exceed the decreasing ramp value (since it has the most "right" bits vis-a-vis the prompt value). As soon as the word #2 amplifier outputs to its associated row conductor 20 that output is sensed at the OR gate 52 causing it to output a RAMP STOP command to the ramped read driver 48. Thus, the contents of word #2, and only word #2, appears at the outputs 38 of the sense amplifiers 36, as is proper. The same operation would, of course, take place if the prompt value was an exact match to a word in the input matrix 42 or if the values in the input matrix 42 were indices, or what have you, instead of being a duplicate of the contents of the output matrix 44 as in the example.

Thus, it can be seen that the memory of the present invention provides a multitude of advantages over the prior art including resistance to radiation effects, high density in small volume, simple read technology, and associative recall, including recall of the closest to a prompt value.

We claim:

1. A multi-layered, thin-film, digital memory comprising:
   (a) a first layer comprising a plurality of electrically separated row conductors;
   (b) a second layer comprising a plurality of electrically separated column conductors intersect electrically separated from said row conductors; and,
   (c) a plurality of resistance elements electrically connected between said row conductors and said column conductors at respective intersections of said row conductors and said column conductors, each resistance element comprising, in series, a first resistor of sufficiently high ohmage to conduct a sensible current therethrough with virtually no heat-generating power consumption when a low voltage as employed in thin-film applications is applied thereacross and a second resistor of sufficiently high ohmage to conduct no sensible current therethrough when a low voltage as employed in thin-film applications is applied thereacross, said second resistor having the quality of breaking down to create a short therethrough upon the application of a breakdown level voltage across said second resistor.

2. The thin-film digital memory of claim 1 wherein:
   said second resistors are each formed of a resistive third layer disposed between overlapped conductor portions on said first and second layers.

3. The thin-film digital memory of claim 1 and additionally comprising:
   a plurality of bi-stable sense amplifier means each having an input connected to a respective one of said column conductors for indicating at an output thereof when a current flow is detected at said input in the one of said column conductors connected thereto.

4. A multi-layered, thin-film, digital memory having associative recall comprising:
   (a) a first memory matrix and a second memory matrix, each said memory matrix comprising,
      (a1) a first layer comprising a plurality of electrically separated row conductors;
      (a2) a second layer comprising a plurality of electrically separated column conductors intersecting but electrically separated from said row conductors; and,
      (a3) a plurality of resistance elements electrically connected between said row conductors and said column conductors at respective intersections of said row conductors and said column conductors, each resistance element comprising, in series, a first resistor of sufficiently high ohmage to conduct a sensible current therethrough with virtually no heat-generating power consumption when a low voltage as employed in thin-film applications is applied thereacross and a second resistor of sufficiently high ohmage to conduct no sensible current therethrough when a low voltage as employed in thin-film applications is applied thereacross, said second resistor having the quality of breaking down to create a short therethrough upon the application of a breakdown level voltage across said first and second resistors;
   (b) a plurality of bi-stable sense amplifier means each having an input connected to a respective one of said column conductors of said second matrix for indicating at an output thereof when a current flow is detected at said input in the one of said column conductors of said second matrix connected thereto;

(c) a plurality of current summing amplifier means each having an output connected to a respective one of said row conductors of said second matrix for applying a voltage to the one of said row conductors of said second matrix connected thereto when the current into a second input thereof exceeds the current into a first input thereof, said row conductors of said first matrix being electrically connected to respective ones of said second inputs;

(d) a plurality of bi-stable read driver means each having an output connected to a respective one of said column conductors of said first matrix for outputting a voltage when an input thereof has a binary "1" prompt value applied thereto and for not outputting a voltage when said input thereof has a binary "0" prompt value applied thereto; and, (e) ramped read driver means having an output connected to said first inputs of said current summing amplifier means for producing a downward ramp at said output thereof starting at a value higher than the maximum possible value at said second inputs and decreasing until one of said current summing amplifier means has its said second input value higher than the output of said ramped read driver means and applies a said voltage to the one of said row conductors of said second matrix connected thereto.

5. The multi-layered, thin-film, digital memory having associative recall of claim 4 wherein:
said second resistors are each formed of a resistive third layer disposed between overlapped conductor portions on said first and second layers.

6. The multi-layered, thin-film, digital memory having associative recall of claim 4 and additionally comprising:
OR gate means having a plurality of inputs connected to respective ones of said row conductors of said second matrix for outputting a stop ramp command to said ramped read driver means to cause said ramp to stop when said one of said current summing amplifier means has its said second input value higher than the output of said ramped read driver means and applies a said voltage to the one of said row conductors of said second matrix connected thereto.

7. The method of forming and writing into a multi-layered, thin-film, read-only, digital memory comprising:
(a) forming a first layer comprising a plurality of electrically separated row conductors;
(b) forming a second layer comprising a plurality of electrically separated column conductors intersecting but electrically separated from the row conductors;
(c) forming a plurality of resistance elements electrically connected between the row conductors and the column conductors at respective intersections of the row conductors and the column conductors wherein each resistance element comprises, in series, a first resistor of sufficiently high ohmage to conduct a sensible current therethrough with virtually no heat-generating power consumption when a low voltage as employed in thin-film applications is applied thereacross and a second resistor of sufficiently high ohmage to conduct no sensible current therethrough when a low voltage as employed in thin-film applications is applied thereacross; and, (d) writing data into the memory by applying a voltage across each second resistor wherein there is to be a binary "1" sufficiently high so as to break down that second resistor and create a short therethrough.

8. The method of claim 7 and additionally comprising the steps for reading the contents of the memory of:
(a) connecting the inputs of a plurality of bi-stable sense amplifiers to respective ones of the column conductors to indicate at outputs thereof when a current flow is detected at the input in the one of the column conductors connected thereto;
(b) applying a voltage to the row conductor associated with a word of the memory to be read; and,
(c) reading the contents of the word at the outputs of the sense amplifiers.

9. The method of constructing, writing to, and reading from a multi-layered, thin-film, digital memory with associative recall comprising the steps of:
(a) constructing a first memory matrix and a second memory matrix, the construction of each matrix comprising the steps of,
(a1) forming a first layer comprising a plurality of electrically separated row conductors;
(a2) forming a second layer comprising a plurality of electrically separated column conductors intersecting but electrically separated from the row conductors; and,
(a3) forming a plurality of resistance elements electrically connected between the row conductors and the column conductors at respective intersections of the row conductors and the column conductors wherein each resistance element comprises, in series, a first resistor of sufficiently high ohmage to conduct a sensible current therethrough with virtually no heat-generating power consumption when a low voltage as employed in thin-film applications is applied thereacross and a second resistor of sufficiently high ohmage to conduct no sensible current therethrough when a low voltage as employed in thin-film applications is applied thereacross;
(b) writing output data into the second memory matrix by applying a voltage across each second resistor thereof wherein there is to be a binary "1" sufficiently high so as to break down that second resistor and create a short therethrough;
(c) writing associative input data into the first memory matrix by applying a voltage across each second resistor thereof wherein there is to be a binary "1" sufficiently high so as to break down that second resistor and create a short therethrough;
(d) connecting the inputs of a plurality of bi-stable sense amplifiers to respective ones of the column conductors of the second matrix to indicate at outputs thereof when a current flow is detected at the input in the one of the column conductors of the second matrix connected thereto;
(e) connecting the outputs of a plurality of current summing amplifiers to respective ones of the row conductors of the second matrix to apply a voltage to the one of the row conductors of the second matrix connected thereto when the current into a second input thereof exceeds the current into a first input thereof;
(f) electrically connecting respective ones of the row conductors of the first matrix to the second inputs;

(g) connecting the outputs of a plurality of bi-stable read drivers to respective ones of the column conductors of the first matrix to output a voltage when an input thereof has a binary "1" prompt value applied thereto and to not output a voltage when the input thereof has a binary "0" prompt value applied thereto;

(h) applying a prompt value to be used for associative recall to the inputs of the plurality of read drivers;

(i) connecting the output of a ramped read driver to the first inputs of the current summing amplifiers and producing a downward ramp at the output thereof starting at a value higher than the maximum possible value at the second inputs and decreasing until one of the current summing amplifiers has its second input value higher than the output of the ramped read driver and applies a voltage to the one of the row conductors of the second matrix connected thereto; and, (j) reading the contents of the associated word in the second memory matrix at the outputs of the sense amplifiers.

10. The method of claim 9 and additionally comprising the steps of:

(a) connecting the inputs of an OR gate to respective ones of the row conductors of the second matrix; and, (b) outputting a stop ramp command from the OR gate to the ramped read driver to cause the ramp to stop when a current summing amplifier has its second input value higher than the output of the ramped read driver and applies a voltage to the one of the row conductors of the second matrix connected thereto.

11. A multi-layered, thin-film, digital memory comprising:

(a) a first layer comprising a plurality of electrically separated row conductors;

(b) a second layer comprising a plurality of electrically separated column conductors intersecting but electrically separated from said row conductors; and, (c) a plurality of resistance element means electrically connected between said row conductors and said column conductors at respective intersections of said row conductors and said column conductors for creating a first resistor of sufficiently high ohmage to conduct a sensible current therethrough with virtually no heat-generating power consumption when a low voltage as employed in thin-film applications is applied thereacross at locations where there is to be a first binary value and for creating a second resistor of sufficiently high ohmage to conduct no sensible current therethrough when a low voltage as employed in thin-film applications is applied thereacross at locations where there is to be a second binary value.

12. The thin-film digital memory of claim 11 wherein: said resistance element means comprises a said first resistor and a said ~stor in series, said second resist~ 'ity of breaking down~ ~h upon the ap- age across said u 12 wherein: \f a resistive ed conduc- 'ers.

14. The thin-film digital memory of claim 11 and additionally comprising:

a plurality of bi-stable sense amplifier means each having an input connected to a respective one of said column conductors for indicating at an output thereof when a current flow is detected at said input in the one of said column conductors connected thereto.

15. A multi-layered, thin-film, digital memory having associative recall comprising:

(a) a first memory matrix and a second memory matrix, each said memory matrix comprising, (a1) a first layer comprising a plurality of electrically separated row conductors;

(a2) a second layer comprising a plurality of electrically separated column conductors intersecting but electrically separated from said row conductors; and, (a3) a plurality of resistance element means electrically connected between said row conductors and said column conductors at respective intersections of said row conductors and said column conductors for creating a first resistor of sufficiently high ohmage to conduct a sensible current therethrough with virtually no heat-generating power consumption when a low voltage as employed in thin-film applications is applied thereacross at locations where there is to be a first binary value and for creating a second resistor of sufficiently high ohmage to conduct no sensible current therethrough when a low voltage as employed in thin-film applications is applied thereacross at locations where there is to be a second binary value;

(b) a plurality of bi-stable sense amplifier means each having an input connected to a respective one of said column conductors of said second matrix for indicating at an output thereof when a current flow is detected at said input in the one of said column conductors of said second matrix connected thereto;

(c) a plurality of current summing amplifier means each having an output connected to a respective one of said row conductors of said second matrix for applying a voltage to the one of said row conductors of said second matrix connected thereto when the current into a second input thereof exceeds the current into a first input thereof, said row conductors of said first matrix being electrically connected to respective ones of said second inputs;

(d) a plurality of bi-stable read driver means each having an output connected to a respective one of said column conductors of said first matrix for outputting a voltage when an input thereof has a binary "1" prompt value applied thereto and for not outputting a voltage when said input thereof has a binary "0" prompt value applied thereto; and, (e) ramped read driver means having an output connected to said first inputs of said current summing amplifiers for producing a downward ramp at said output thereof starting at a value higher than the maximum possible value at said second inputs and decreasing until one of said current summing amplifier means has its said second input value higher than the output of said ramped read driver means and applies a said voltage to the one of said row conductors of said second matrix connected thereto.

16. The thin-film digital memory of claim 15 wherein:
said resistance element means each comprises a said first resistor and a said second resistor in series, said second resistor having the quality of breaking down to create a short therethrough upon the application of a breakdown level voltage across said second resistor.

17. The thin-film digital memory of claim 16 wherein:
(a) said first resistor is of about one meg-ohm resistance; and,
(b) said second resistor is several orders of magnitude greater in resistance than said first resistor.

18. The multi-layered, thin-film, digital memory having associative recall of claim 16 wherein: said second resistors are each formed of a resistive third layer disposed between overlapped conductor portions on said first and second layers.

19. The multi-layered, thin-film, digital memory having associative recall of claim 15 and additionally comprising:
OR gate means having a plurality of inputs connected to respective ones of said row conductors of said second matrix for outputting a stop ramp command to said ramped read driver means to cause said ramp to stop when said one of said current summing amplifier means has its said second input value higher than the output of said ramped read driver means and applies a said voltage to the one of said row conductors of said second matrix connected thereto.

* * * * *